United States Patent
Maziasz et al.

(10) Patent No.: US 8,726,218 B2
(45) Date of Patent: May 13, 2014

(54) TRANSISTOR-LEVEL LAYOUT SYNTHESIS

(75) Inventors: Robert L. Maziasz, Austin, TX (US); Vladimir P. Rozenfeld, Andreevka (RU); Iouri G. Smirnov, Andreevka (RU); Alexander V. Zhuravlev, Zelenograd (RU)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/398,177

(22) Filed: Feb. 16, 2012

(65) Prior Publication Data
US 2012/0159412 A1   Jun. 21, 2012

(30) Foreign Application Priority Data
Dec. 19, 2011   (WO) ................ PCT/RU2011/000993

(51) Int. Cl.
*G06F 17/50* (2006.01)

(52) U.S. Cl.
USPC .......................................................... 716/127

(58) Field of Classification Search
USPC .......................................................... 716/127
See application file for complete search history.

(56) References Cited

U.S. PATENT DOCUMENTS

| | | | |
|---|---|---|---|
| 5,847,968 A | 12/1998 | Miura et al. | |
| 7,062,739 B2 * | 6/2006 | Monthie et al. | 716/103 |
| 7,392,498 B1 | 6/2008 | Srinivasan et al. | |
| 7,739,646 B2 | 6/2010 | Lin et al. | |
| 2001/0027553 A1 * | 10/2001 | Tanaka et al. | 716/2 |
| 2004/0003366 A1 * | 1/2004 | Suzuki | 716/11 |
| 2008/0127000 A1 | 5/2008 | Majumder et al. | |

OTHER PUBLICATIONS

Basaran, B. et al., "GeneSys: A Leaf-Cell Layout Synthesis System for GHz VLSI Designs," IEEE Proceedings of the Twelfth International Conference on VLSI Design; Jan. 7-10, 2009; Goa, India; Print ISBN: 0-7695-0013-7; 5 pages.

* cited by examiner

*Primary Examiner* — Jack Chiang
*Assistant Examiner* — Brandon Bowers (57) ABSTRACT

A layout tool partially replicates the layout of a base cell to determine the layout for a target cell. The base cell is information representing an arrangement of a set of transistors having an established layout. The target cell is information indicating the desired arrangement of another set of transistors. The layout tool identifies correspondences between subsets of the base cell transistors and subsets of the target cell transistors and replicates the layout of the identified base cell subsets to determine the layout for the identified target cell subsets. In addition, the layout tool can identify base cell subsets that closely match target cell subsets, but for which the layout cannot be exactly replicated because of obstructions in the target cell subsets. For such identified base cell subsets, the layout tool can determine a layout by adjusting the base cell subset layouts to avoid the obstructions.

15 Claims, 8 Drawing Sheets

TRANSISTOR-LEVEL LAYOUT SYNTHESIS

CROSS-REFERENCE TO RELATED APPLICATION(S)

This application claims priority to International Application Number PCT/RU2011/000993, filed Dec. 19, 2011, entitled "Transistor-Level Layout Synthesis," the disclosure of which is hereby expressly incorporated by reference in its entirety.

FIELD OF THE DISCLOSURE

The present disclosure relates to integrated circuit design, and more particularly to layout of an integrated circuit device.

BACKGROUND

An integrated circuit device can be created using automated layout tools that places standard cells, and the connections between the standard cells, in an arrangement based on both the design of the integrated circuit device and specified layout rules. The resulting configuration of cells and connections is referred to as the device layout, and is used as a basis for forming the integrated circuit device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

FIGS. 1-9 illustrate techniques to reuse a portion the layout of a base cell to determine the layout for a target cell. The base cell is a cell representing the connectivity and established layout of a set of transistors. The target cell is information indicating the connectivity of another set of transistors for which a layout has not been determined. A layout tool identifies subsets of the base cell transistors with connectivity and placement corresponding to the connectivity and placement of subsets of the target cell transistors, and creates at least a partial layout for the target cell by replicating the routing of the identified base cell subsets. In addition, the layout tool can identify base cell subsets that closely match target cell subsets, but for which the routing cannot be exactly replicated because of obstructions in the target cell subsets. For such identified base cell subsets, the layout tool can determine a layout by adjusting the base cell subset layouts to avoid the obstructions. Accordingly, portions of a base cell layout are reused to determine portions of a target cell layout, thereby increasing the efficiency of the routing process and providing for more consistency in the routing of target cells.

As used herein, a cell refers to information indicating the connectivity, placement, and in some cases the layout, of two or more transistors. The cell can represent a single logic gate, a collection of logic gates, a storage element, or combination thereof, or any other arrangement of transistors. As used herein, a subcell refers to a subset of the transistors in a cell. A subset refers to a part of a set that includes some, but not all, members of its parent set. Accordingly, a subcell includes some, but not all, of the transistors in its cell, and a cell always has at least two subcells. Depending on the connectivity of the transistors in a subcell, the subcell can represent any logic gate, collection of logic gates, storage element, and the like, or combination thereof. A base cell refers to a cell for which both the connectivity and layout of the cell, including placement of the cell's transistors and the routing of connections between the transistors, have been determined. A target cell refers to a cell for which the connectivity and placement of transistors in the cell have been determined, but for which the routing of connections between the transistors of the cell has not been determined.

Figure 1:
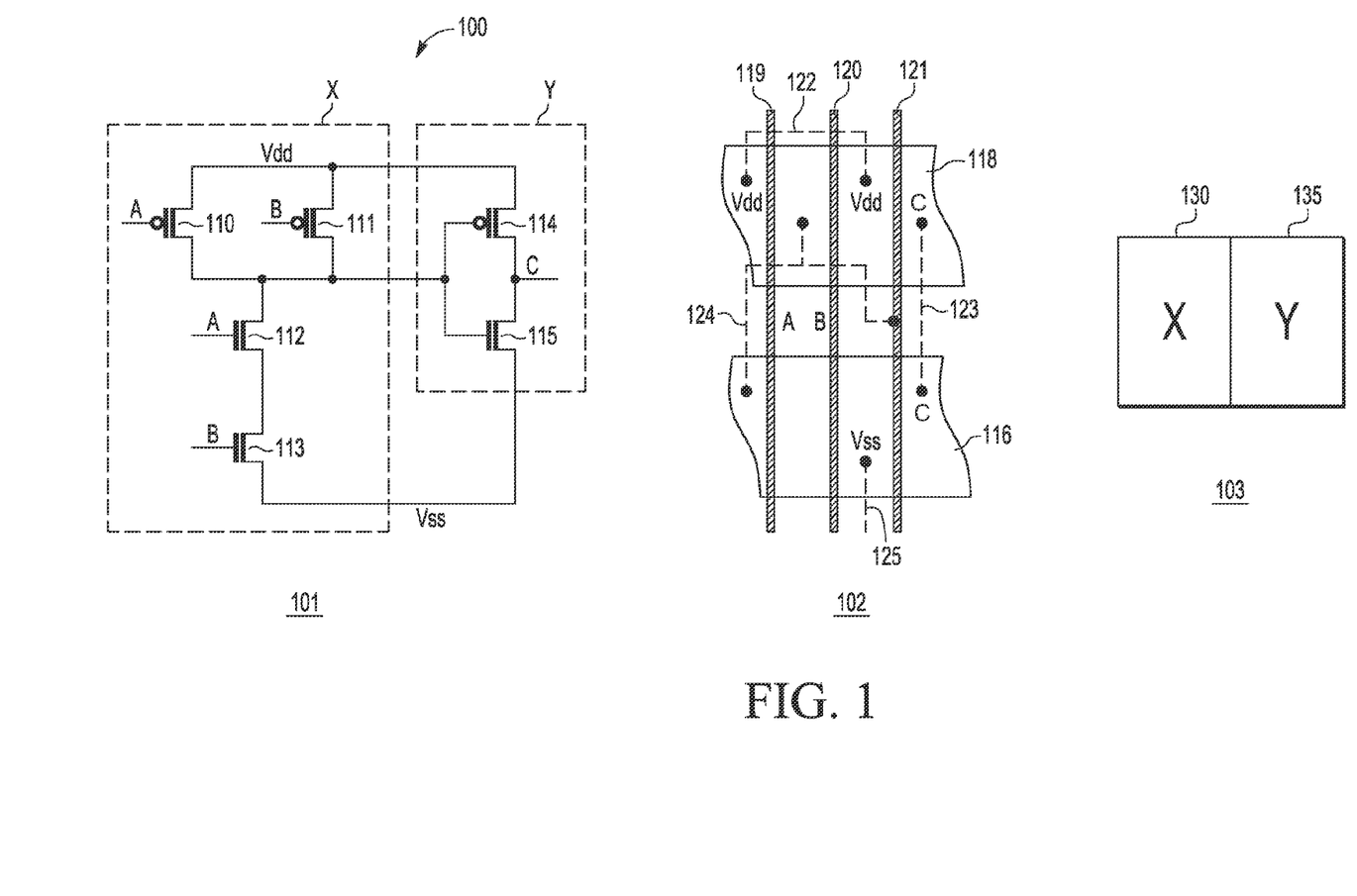
FIG. 1 is a combined block and circuit diagram illustrating different representations of a cell for an integrated circuit device in accordance with one embodiment of the present disclosure.
Figure 2:
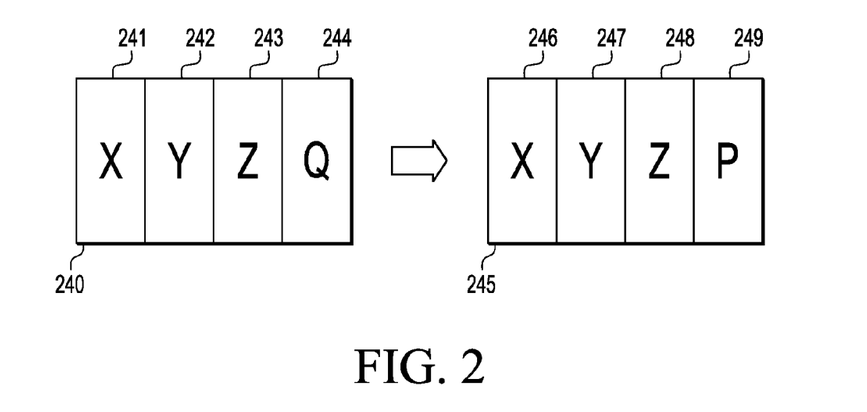
FIG. 2 is a block diagram illustrating the relationship between a base cell and a target cell in accordance with one embodiment of the present disclosure.
Figure 3:
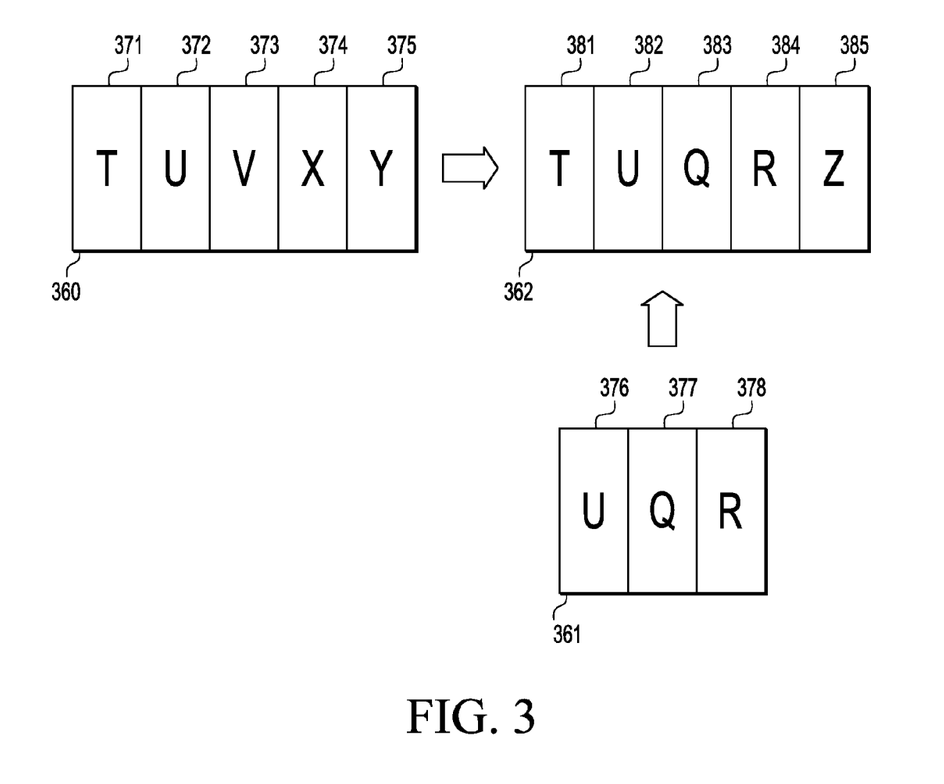
FIG. 3 is a block diagram illustrating the relationship between two base cells and a target cell in accordance with one embodiment of the present disclosure.

FIG. 1 illustrates three different views of a cell 100 and its corresponding subcells in accordance with one embodiment of the present disclosure. In particular, view 101 illustrates a circuit diagram of the transistors 110, 111, 112, 113, 114, and 115 that are arranged to form cell 100. Cell 100 is connected as follows: the source terminals of p-type transistors 110, 111, and 114 are connected to a voltage reference $V_{dd}$. The drain terminals of transistors 110 and 111 are connected to the drain terminal of n-type transistor 112. The source terminal of transistor 112 is connected to the drain terminal of transistor 113. The drain terminal of transistor 114 is connected to the drain terminal of transistor 115. The source terminals of transistors 113 and 114 are connected to voltage reference $V_{SS}$. The gates of transistors 110 and 112 are connected to a node labeled "A", the gate electrodes of transistors 111 and 113 are connected to a node labeled "B", and the gate electrodes of transistors 114 and 115 are connected to the drain terminals of transistors 110 and 111.

The connectivity of transistors 110-113 form a NAND gate, wherein the node A is one input of the NAND gate, the node B is another input of the NAND gate, and the NAND gate output is provided at the drain terminals of the transistors 110 and 111. The connectivity of the transistors 114 and 115 form an inverter, wherein the input of the inverter is applied at the gate electrodes of the transistors 114 and 115 and the output of the inverter is provided at the node labeled "C." The NAND gate formed by transistors 110-113 is a subcell labeled "X" and the inverter formed by the transistors 112 and 113 form a subcell labeled subcell "Y."

View 102 illustrates a top view of a portion of the semiconductor layers that form cell 100. Accordingly, view 102 illustrates a p-diffusion region 118, an n-diffusion region 116, and interconnects 119, 120, and 121 at an interconnect layer, such as a polysilicon layer. In addition, view 102 illustrates interconnects 122-125 at another interconnect layer, such as a metal layer, to provide the connections between the transistors and reference voltages illustrated at view 101. It will be appreciated that a cell can include layout features not specifically illustrated at view 102, such as vias, contacts, and the like.

View 103 of FIG. 1 illustrates a placement block diagram (layout diagram) of cell 100 including subcell X (numbered as subcell 130) and subcell Y (numbered as subcell 135). For purposes of illustration, cells and subcells will be illustrated in the following figures in placement block diagram form similar to view 103.

As described further herein, a layout synthesis tool can create the layout of a target cell by partially replicating the layout of one or more base cells. This can be better understood with reference to FIG. 2, which illustrates a base cell 240 and a target cell 245. The base cell 240 includes base subcell 241 (designated subcell X), subcell 242 (designated subcell Y), subcell 243 (designated subcell Z), and subcell 244 (designated subcell Q). The target cell 245 includes subcells 246-248, respectively designated subcells X-Z to indicate that they respectively have the connectivity and placement of transistors as subcells 241-243, and further includes subcell 249 (designated subcell P). A layout tool can identify subcells of the target cell 245 having transistors with the same connectivity as subcells of the base cell 240. The identified subcells are referred to as candidate subcells of the target cell. The layout tool can identify whether the candidate subcell is expected to be able to employ a similar routing of connections as the corresponding subcell of the base cell. The identified candidate subcells are referred to as replicable subcells.

In one embodiment a candidate subcell is determined to be a replicable subcell if the connectivity and placement of its surrounding subcells match the connectivity of the surrounding subcells of the corresponding base cell subcell. Thus, in the illustrated example of FIG. 2, subcell 246 is a replicable subcell because its transistor placement and connectivity matches subcell 241 and the placement and connectivity of its surrounding subcells are the same as subcell 241 (subcell 247 has the same connectivity and placement as subcell 242). Similarly, subcell 247 is determined to be replicable because its transistor arrangement matches subcell 242 and its surrounding subcells 246 and 248 match the subcells surrounding subcell 242 (subcells 241 and 243, respectively). However, subcell 248 is determined not to be a replicable subcell because, although its transistor connectivity and placement is the same as the arrangement of subcell 243, the placement and connectivity of its surrounding subcells are different than the placement and connectivity of the surrounding subcells at base cell 240. In particular, subcell 249 is different from subcell 244. Subcell 249 is also determined to be non-replicable because no corresponding connectivity and placement of transistors for subcell 249 can be identified at base cell 240.

The layout tool can form a partial layout for the target cell 245 by replicating, for each replicable subcell, the routing of the corresponding subcell of base cell 240. Thus, in the example of FIG. 2, the layout tool can form the routing for subcell 246 by replicating the routing of subcell 241 and form the routing for subcell 247 by replicating the routing of subcell 242. In addition, the layout tool can form the routing for subcell 248 by modifying the routing for subcell 243 as described further herein. With respect to subcell 249, the layout tool can use conventional routing techniques, such as maze routing, to form the routing for the subcell. Thus, the layout tool can form the layout (placement and routing) of a target cell by partially replicating the layout of a base cell. In contrast, conventional layout tools form the layout of a target cell either by entirely replicating the layout of one or more base cells, or by employing conventional techniques, such as maze routing, to entirely route the target cell. Replication of the entire layout of multiple base cells can result in an undesirably large target cell. Further, employing conventional techniques to form entirely new routing for a target cell can take an undesirably long amount of time and result in the creation of target cells having widely varying layout patterns, increasing the difficulty of layout review, and introducing unnecessary variations into a layout.

It will be appreciated that the layout tool described herein can, for a selected target cell, determine the layout by partially replicating more than one base cell. This can be better understood with reference to FIG. 3, which illustrates base cells 360 and 361 and target cell 362. Base cell 360 includes subcells 371-375, base cell 361 includes subcells 376-378, and target cell 362 includes subcells 381-385. Each of the illustrated subcells is designated by a letter, with subcells designated by the same letter having the same connectivity and placement of transistors. Thus, for example, subcell 371 has a common connectivity and placement of transistors as subcell 381, as both are designated by the letter T. In the illustrated example of FIG. 3, the replicable subcells of target cell 362 are subcells 381 and 383. In particular, subcell 381 is replicable based on subcell 371 of base cell 360 while subcell 383 is replicable based on subcell 377 of base cell 361.

Figure 4:
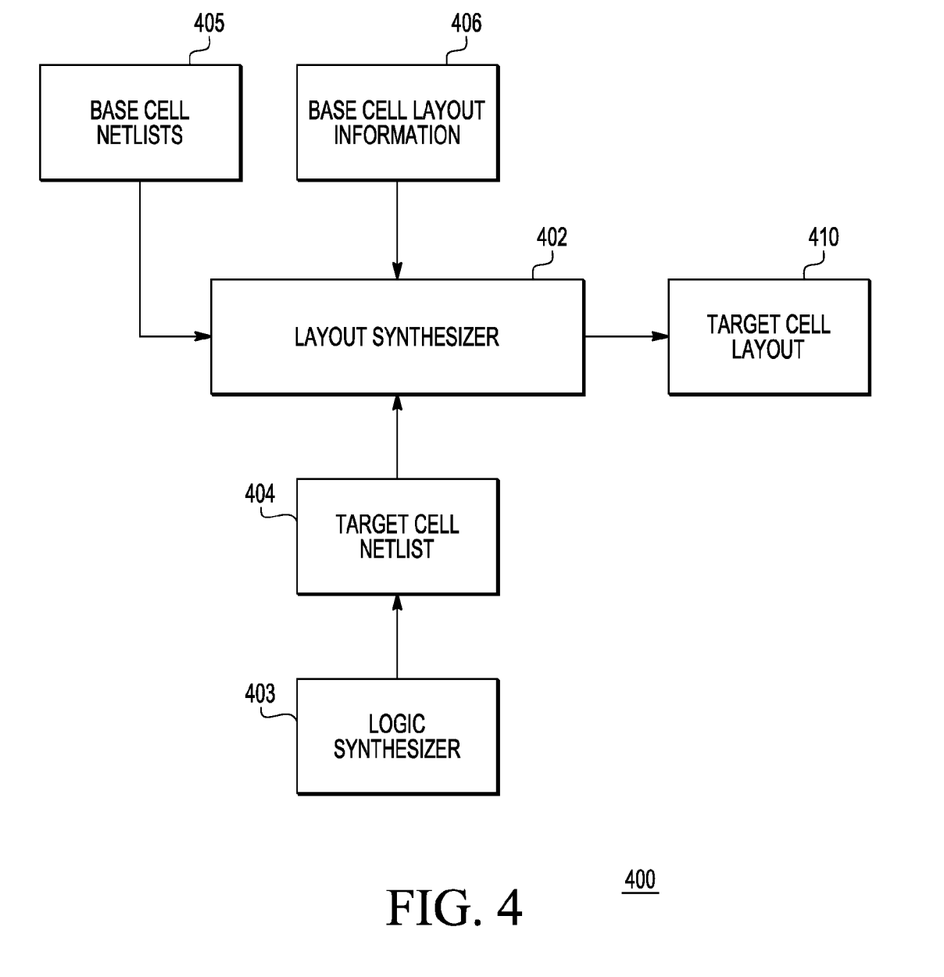
FIG. 4 is a block diagram of a device layout design system in accordance with one embodiment of the present disclosure.

FIG. 4 illustrates a layout design system 400 in accordance with one embodiment of the present disclosure. The design system 400 includes a layout synthesizer 402 and a logic synthesizer 403. The logic synthesizer 403 is a device, such as a computer, configured to determine and output a target cell netlist 404 based on input information indicating desired logical behavior of a target cell. To illustrate, a user can provide the input information in the form of a truth table or other information that defines the desired logical behavior for the target cell. In response, the logic synthesizer determines a combination and arrangement of logic gates and other elements that are predicted to produce the indicated logical behavior and produces the target cell netlist 404 based on the determination. The target cell netlist 404 therefore identifies the elements that make up the target cell, as well as the electrical connections between the elements.

The layout synthesizer 402 accesses the target cell netlist 404, base cell netlists 405 and base cell layout information 406 to determine a target cell layout 410 for the target cell being designed. The base cell netlists 405 are a set of netlists with each netlist in the set identifying the elements and electrical connections between elements of a corresponding base cell. The base cell layout information 406 indicates the spatial relationship between transistors of each base cell, referred to as the placement of the cell, and the spatial positions of the connections between the transistors, referred to as the routing of the cell.

Figure 5:
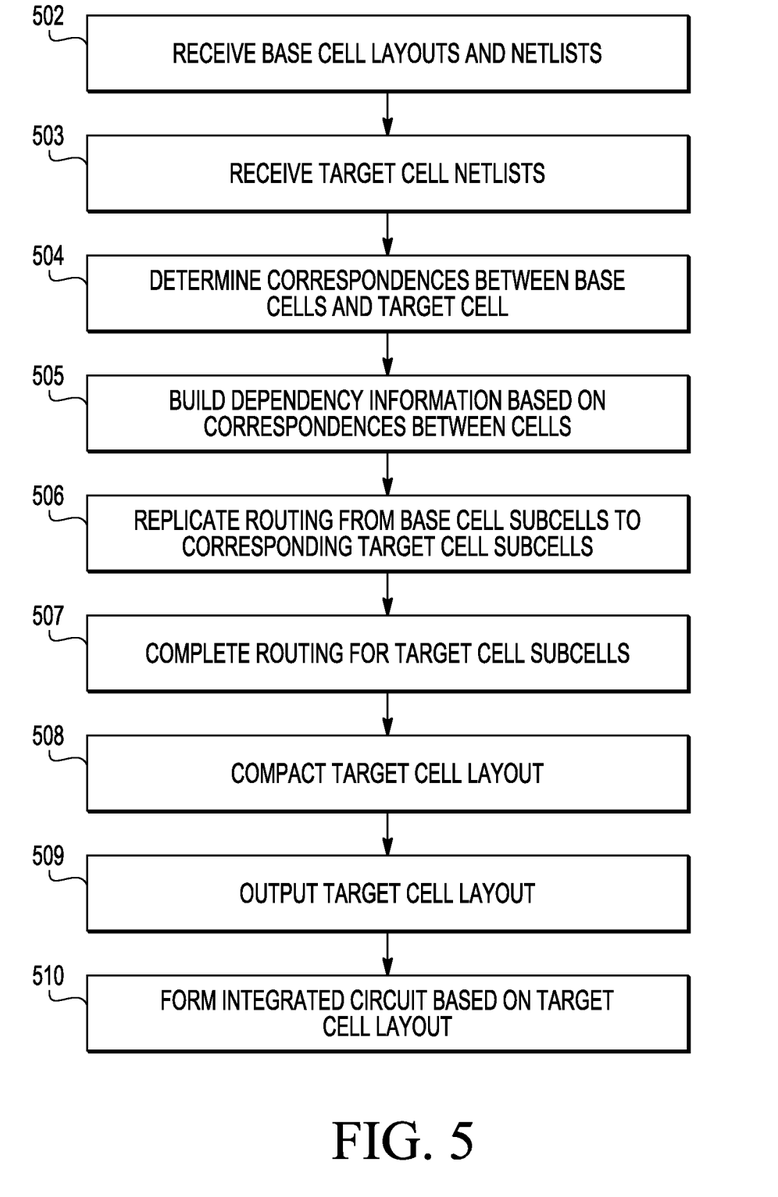
FIG. 5 is a flow diagram of a method of partially replicating the layout of base cells to form the layout for a target cell in accordance with one embodiment of the present disclosure.

The operation of the layout synthesizer 402 can be better understood with reference to FIG. 5, which illustrates a flow diagram of a method of determining a layout for a target cell in accordance with one embodiment of the present disclosure. At block 502 the layout synthesizer 402 receives the base cell netlists 405 and the base cell layout information 406. At block 503 the layout synthesizer 402 receives the target cell netlist 404. At block 504 the layout synthesizer 402 determines correspondences between subcells of the base cells and subcells of the target cell. In an embodiment, the layout synthesizer 402 uses pattern matching techniques to identify corresponding patterns of transistors between base cell subcells and target cell subcells. In particular, the layout synthesizer 402 can first analyze the netlist of the target cell to determine the target cell subcells. In one embodiment, subcells are identified by determining arrangements of transistors that can be traversed, from reference voltage $V_{dd}$ to $V_{ss}$, such that the only time a gate terminal is traversed in the path is between the drain and source terminal of the transistor associated with the respective gate terminal. Thus, referring to view 101 of FIG. 1, transistors 110-113 are determined to be a subcell because the layout synthesizer 402 can trace a path from $V_{dd}$ to $V_{ss}$ through transistors 110, 112, and 113, and transistors 111, 112, and 113 such that the gate terminals of each transistor are only traversed between the transistor's respective gate and source terminals. Similarly, the transistors 114 and 115 are determined to be a subcell because the layout synthesizer 402 can trace a path from $V_{dd}$ to $V_{ss}$ through transistors 114 and 115 such that the gate terminals of each transistor are only traversed between the transistor's respective gate and source terminals. However, the transistors 114 and 115 cannot form a subcell with transistor 110, because the only path that can be traced between $V_{dd}$ and $V_{ss}$ that includes all three transistors must traverse at least one of the gate electrodes of transistors 114 and 115 without first having traversed the respective source or drain electrodes. It will be appreciated that subcells can be formed in other ways, such as by identification of particular logic functions, pattern recognition, and the like. After the layout synthesizer 402 identifies the netlists for the target subcells and the transistor placement for each subcell, the target subcell netlists and placement information are compared to the base cell netlists 405 and layout information 406 to determine which of the target subcells correspond to subcells of the base cells.

Figure 6:
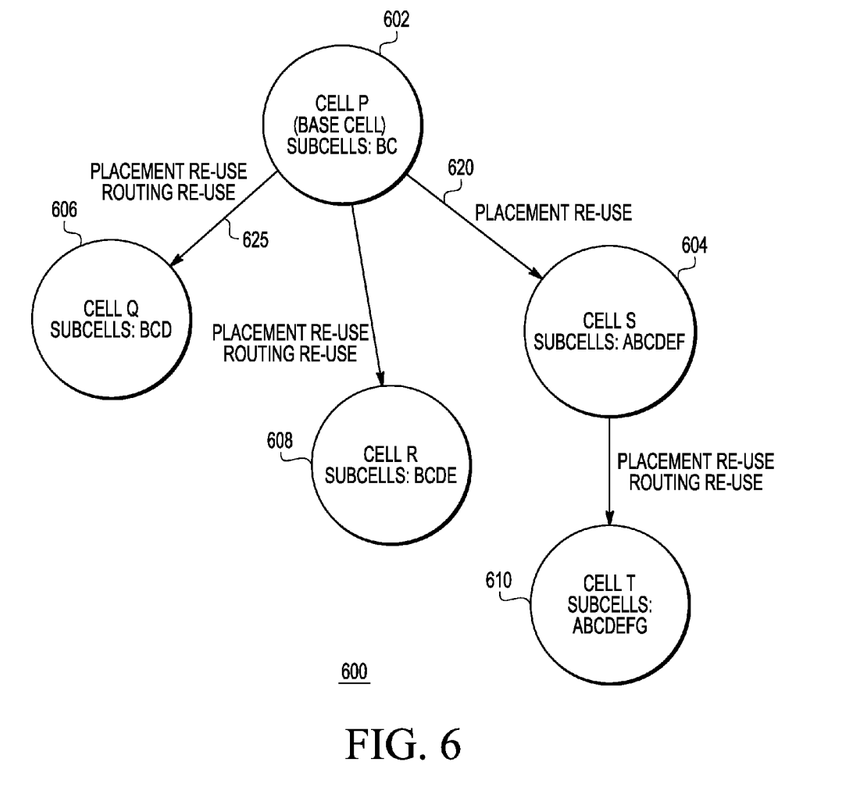
FIG. 6 is a diagram of dependency information in accordance with one embodiment of the present disclosure.

At block 505 the layout synthesizer 402 builds dependency information based on the correspondences identified at block 504. The dependency information indicates which cells of an integrated circuit layout are base cells and which cells can are target cells. An example of dependency information is illustrated at FIG. 6, which depicts dependency information as dependency graph 600. Dependency graph 600 includes nodes 602, 604, 606, 608, and 610, wherein each node represents a cell. Letters under the cell name (BC, BCD, BCDE, etc. . . . ) represent subcells of the cells as illustrated on view 103 of FIG. 1. Each of the lines between the illustrated nodes indicates the relationship between the cells. Thus, for example, line 625 indicates that cell Q at node 606 can re-use transistor placement information and re-use routing information associated with subcell B of cell P at node 602. Line 620 indicates that cell S at node 604 can re-use transistor placement information associated with cell P at node 602, but cannot re-use routing information associated with cell P, because subcells B and C in the base cell P are have different context than subcells B and C of cell S.

As illustrated by node 610 of dependency graph 600, some layouts for some cells can be determined based on the creation of intermediate cells. In particular, cell T at node 610 is synthesized based on cell S at node 604 by re-use of the transistor placement information and re-use of the routing information associated with subcells A, B, C, D, E of cell S. This indicates that, if the layout synthesizer 402 determines a layout for cell S, a portion of that layout can be replicated in the cell T. It will be appreciated that the dependency graph 600 can be stored as a data structure which can be employed by layout synthesizer 402 to determine which cells are target and which cells are base cells, and whether any layouts for intermediate cells are to be determined prior to determining the layout for a specific cell.

Returning to FIG. 5, at block 506 the layout synthesizer 402 replicates, for each replicable subcell of the target cell, the layout of the corresponding subcell of the relevant base cell or intermediate cell. At block 507, the layout synthesizer 402 completes the routing of the target cell for non-replicable subcells. In an embodiment, the layout synthesizer 402 is able to partially route non-replicable candidate subcells based on the corresponding base subcell, as described further below with respect to FIG. 6. For non-candidate subcells, the layout synthesizer 402 can employ a conventional technique such as maze routing to route the subcells. The layouts for each subcell are combined to determine an initial target cell layout. At block 508 the initial target cell layout is compacted to determine a final target cell layout, which is output by the layout synthesizer at block 509 as target cell layout 410. At block 510 the target cell layout 410 is used as a basis to form an integrated circuit device including a module represented by the target cell.

Figure 7:
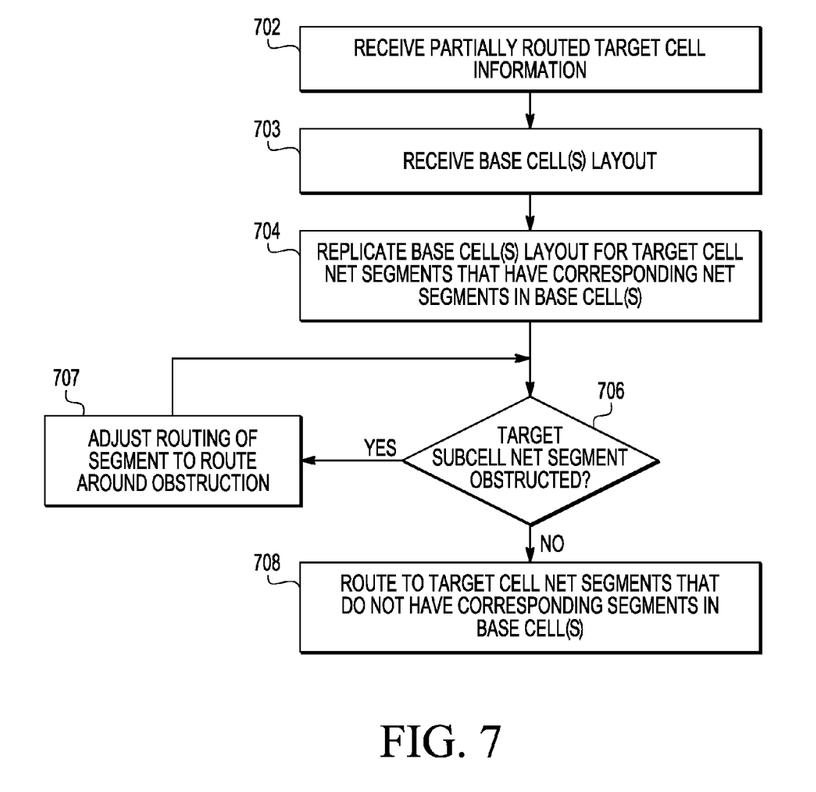
FIG. 7 is a flow diagram of a method of adjusting the layout of a base cell to form the layout for a target cell in accordance with one embodiment of the present disclosure.

FIG. 7 illustrates a flow diagram of a method of adjusting the layout of a base subcell to determine the layout of a corresponding target subcell in accordance with one embodiment of the present disclosure. At block 702, the layout synthesizer 402 accesses the target cell layout 410 to determine which target cell subcells have not been routed. In particular, the layout synthesizer 402 identified which target cell subcells are candidate subcells that are not also replicable subcells. For purposes of discussion, the identified subcells are referred to as partially-replicable subcells. At block 703, the layout synthesizer 402 accesses the base cell layout information 406 to receive the layout for each base subcell corresponding to a partially replicable subcell.

At block 704 the layout synthesizer 402 replicates, for each partially-replicable subcell, the layout of the corresponding base subcell. At block 706 the layout synthesizer 402 determines whether any of the partially-replicable subcells' net segments are obstructed. As used herein, a net segment is obstructed if it connects with another object to which it is not to be connected according to the device design. If any net segments of the partially replicable subcells' net segments are obstructed, the method flow moves to block 707 and the routing of the obstructed net segments are adjusted so that they are no longer obstructed. In an embodiment a routing technique such as maze routing is employed to adjust the routing of the obstructed net segments. Returning to block 706, once the routing of all previously obstructed net segments have been adjusted, the method flow proceeds to block 708 and the layout synthesizer 402 routes any subcell net segments that do not have corresponding net segments in the corresponding subcells of the base cell. The layout of the routed subcells of the target cell is stored at the target cell layout 410.

Figure 8:
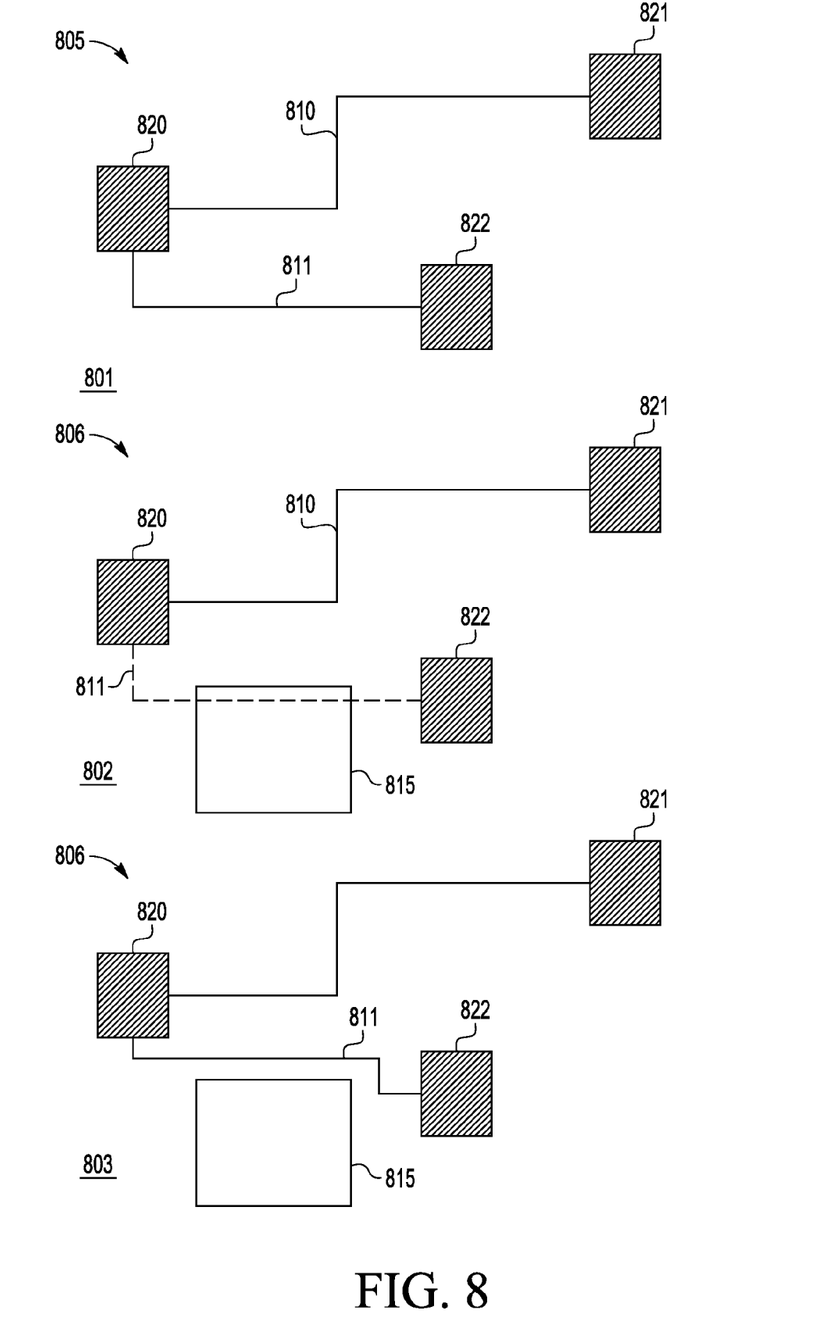
FIG. 8 is a diagram illustrating adjustment of a layout of a base cell to form the layout for a target cell in accordance with one embodiment of the present disclosure.

Operation of the method illustrated at FIG. 7 can be better understood with an example, as illustrated at FIG. 8. In particular FIG. 8 illustrates views of a base subcell 805 and a corresponding target subcell 806 in accordance with one embodiment of the present disclosure. View 801 shows the routing of a base subcell 805, view 802 shows the routing of a target subcell 806 prior to adjusting any net segments because of obstructions, and view 803 shows the routing of target subcell 806 after adjustment of net segments.

As illustrated by view 801, base subcell 805 includes net segment 810, connecting nodes 820 and 821, and net segment 811, connecting nodes 820 and 822. View 802 shows that, after replicating the routing of base subcell 805, net segment 811 is obstructed by an object 815. Object 815 can be a transistor finger, net segment, or any other object. In response to determining that net segment 811 is obstructed, layout synthesizer 402 employs maze routing or other routing technique to adjust net segment 811 until it is no longer obstructed, as illustrated at view 803.

In an embodiment, the layout of cell 806 is determined using a maze router wherein a particular route can be weighted or otherwise indicated as the lowest cost path. The maze router will choose the lowest cost path unless it determines there is an obstruction. Accordingly, the maze router can be provided the routing information of the base subcell 805 such that the layout of the base subcell is indicated as the lowest cost path. The maze router will therefore copy the layout for net segment 810, but will automatically adjust the layout of net segment 811 so that it is not obstructed by object 815.

Figure 9:
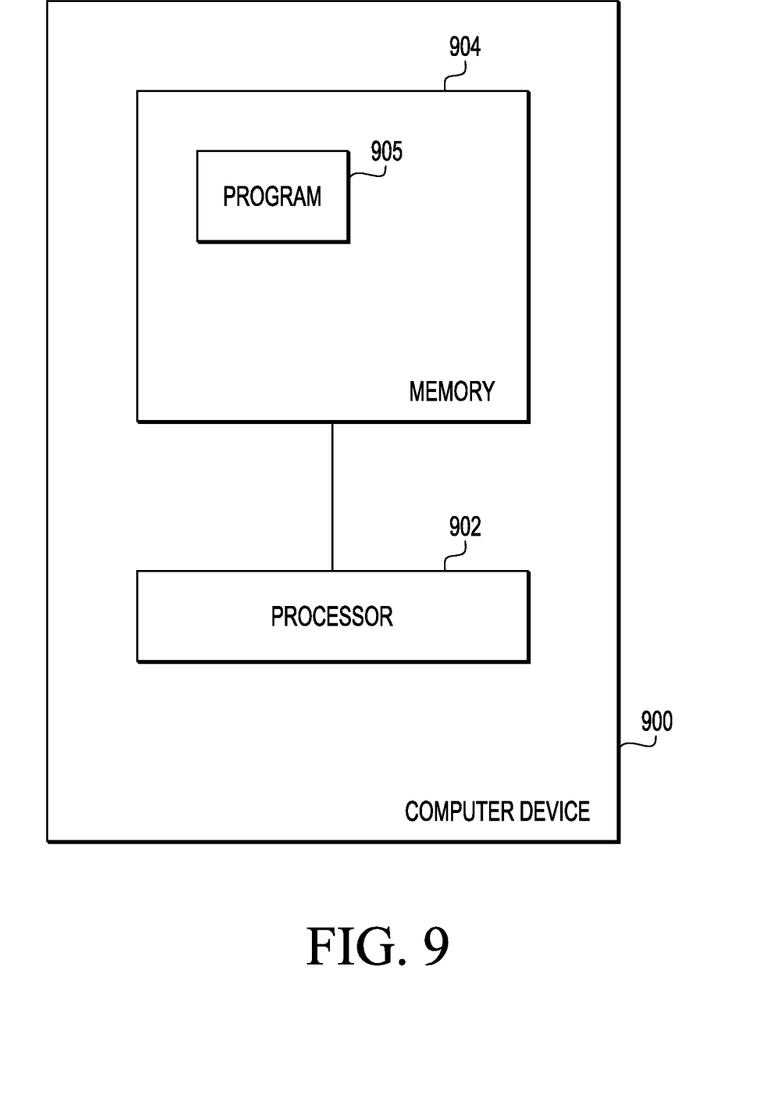
FIG. 9 is a block diagram of a computer device in accordance with one embodiment of the present disclosure.

FIG. 9 illustrates a block diagram of a particular embodiment of a computer device 900. The computer device 900 includes a processor 602 and a memory 604. The memory 604 is accessible to the processor 602.

The processor 902 can be a microprocessor, controller, or other processor capable of executing a set of instructions. The memory 904 is a computer readable medium such as random access memory (RAM), non-volatile memory such as flash memory or a hard drive, and the like. The memory 904 stores a program 905 including a set of instructions to manipulate the processor 902 to perform one or more of the methods disclosed herein. For example, the program 905 can manipulate the processor 902 to identify dependencies between cells, identify the contexts of the subcells of base cells, and determine whether the routing of cells can be partially replicated to determine routing for a target cell.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
replicating, using a computer, routing of a first subset of transistors of a first base cell to determine a layout of a first portion of a target cell;
adjusting a layout of a net segment included in routing of a second subset of transistors of the first base cell to determine a layout of a second portion of the target cell; and
in response to determining that replicating the routing of the second subset of transistors will not result in a second net segment of the second subset of transistors being obstructed, replicating placement of the second net segment.

2. The method of claim 1, further comprising:
replicating routing of a subset of transistors of a second base cell to determine a layout of a second portion of the target cell.

3. The method of claim 1, wherein adjusting the layout comprises:
in response to determining that replicating the layout of the second subset of transistors will result in a first net segment of the second subset of transistors being obstructed, adjusting placement of the first net segment.

4. The method of claim 1, wherein replicating routing of the first subset of transistors comprises replicating routing of the first subset of transistors in response to determining the target cell includes a second subset of transistors of the first base cell.

5. The method of claim 4, wherein replicating routing of the first subset of transistors comprises replicating routing of the first subset of transistors in response to determining a relationship between the first subset of transistors and the second subset of transistors is the same relationship in the first base cell and in the target cell.

6. The method of claim 1, further comprising:
determining dependency information indicating a relationship between placement of transistors at a target cell and placement of transistors at a plurality of base cells; and
wherein replicating routing of the first subset of transistors comprises replicating routing of the first subset of transistors based on the dependency information.

7. The method of claim 1, further comprising forming an integrated circuit based on a layout of the target cell.

8. A method comprising:
replicating, using a computer, routing of a first subset of transistors of a first base cell to determine a first layout of a first portion of a target cell;
adjusting a layout of a net segment included in routing of a second subset of transistors of the first base cell to determine a layout of a second portion of the target cell; and
in response to determining that replicating the routing of the second subset of transistors will not result in a second net segment of the second subset of transistors being obstructed, replicating placement of the second net segment.

9. The method of claim 8, further comprising forming an integrated circuit based on a layout of the target cell.

10. A computer readable medium tangibly embodying a plurality of instructions to manipulate a processor, the plurality of instructions comprising instructions to:
replicate routing of a first subset of transistors of a first base cell to determine a layout of a first portion of a target cell;
adjust a layout of a net segment included in routing of a second subset of transistors of the first base cell to determine a layout of a second portion of the target cell; and
in response to determining that replicating the layout of the second subset of transistors will not result in a second net segment of the second subset of transistors being obstructed, replicate placement of the second net segment.

11. The computer readable medium of claim 10, wherein the plurality of instructions further comprise instructions to:
replicate routing of a subset of transistors of a second base cell to determine a layout of a second portion of the target cell.

12. The computer readable medium of claim 10, wherein the instructions to adjust the layout comprise instructions to:
in response to determining that replicating the layout of the second subset of transistors will result in a first net segment of the second subset of transistors being obstructed, adjust placement of the first net segment.

13. The computer readable medium of claim 10, wherein the instructions to replicate routing of the first subset of transistors comprises instructions to replicate routing of the first subset of transistors in response to determining the target cell includes a second subset of transistors of the first base cell.

14. The computer readable medium of claim 13, wherein the instructions to replicate routing of the first subset of transistors comprises instructions to replicate routing of the first subset of transistors in response to determining a relationship between the first subset of transistors and the second subset of transistors is the same relationship in the first base cell and in the target cell.

15. The computer readable medium of claim 10, wherein the plurality of instructions further comprise instructions to:
   determine dependency information indicating a relationship between placement of transistors at a target cell and placement of transistors at a plurality of base cells; and
   wherein the instructions to replicate routing of the first subset of transistors comprises instructions to replicate routing of the first subset of transistors based on the dependency information.

* * * * *